(12) United States Patent
Koizumi

(10) Patent No.: US 7,314,834 B2
(45) Date of Patent: Jan. 1, 2008

(54) SEMICONDUCTOR DEVICE FABRICATION METHOD

(75) Inventor: Genta Koizumi, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 167 days.

(21) Appl. No.: 11/153,898

(22) Filed: Jun. 16, 2005

(65) Prior Publication Data

US 2006/0138078 A1    Jun. 29, 2006

(30) Foreign Application Priority Data

Jun. 23, 2004   (JP)   ............................. 2004-185544
Apr. 28, 2005   (JP)   ............................. 2005-131009

(51) Int. Cl.
*H01L 21/302*   (2006.01)
(52) U.S. Cl. .................. 438/754; 438/745; 430/312; 430/314
(58) Field of Classification Search ............... 438/745, 438/750, 752, 754; 430/312, 314
See application file for complete search history.

(56) References Cited

U.S. PATENT DOCUMENTS 4,224,361 A * 9/1980 Romankiw .................. 427/259
5,120,622 A * 6/1992 Hanrahan ....................... 430/7
5,432,125 A * 7/1995 Misawa et al. ............. 438/571
7,008,883 B2 * 3/2006 Kashiwagi et al. ......... 438/780

FOREIGN PATENT DOCUMENTS

JP    3339331    8/2002

* cited by examiner

*Primary Examiner*—Lan Vinh
(74) *Attorney, Agent, or Firm*—McGinn IP Law Group, PLLC

(57) ABSTRACT

A semiconductor device fabrication method applies a diazo novolac photoresist to a semiconductor wafer, followed by light exposure of its entire surface to form an underlying resist layer; forms a surface resist layer thereover; performs patterned-light exposure and heat treatment to the photoresist film consisting of the two resist layers formed; and exposes its entire surface to light, followed by development to process the photoresist film into a resist pattern, where the surface resist layer is in an inverse tapered shape, while the underlying resist layer is in an undercut shape relative to the surface resist layer.

6 Claims, 3 Drawing Sheets

FIG. 3
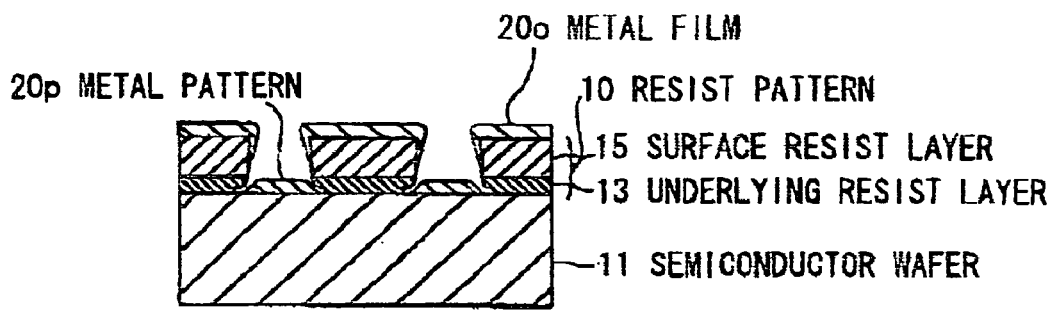
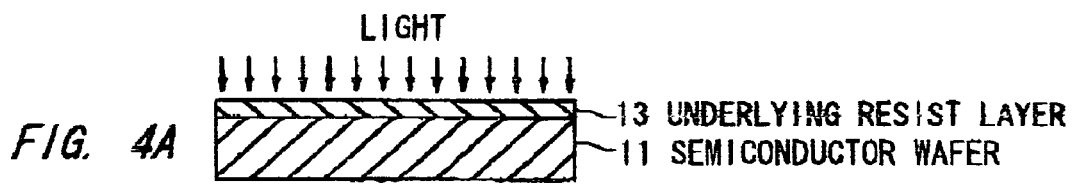
FIG. 4A
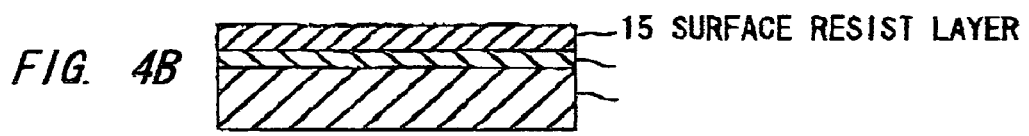
FIG. 4B
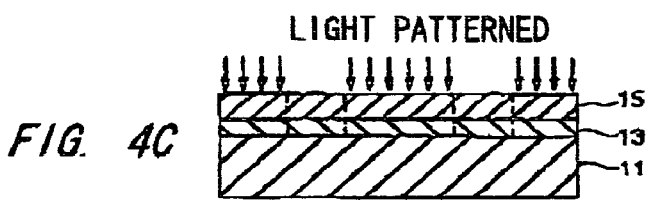
FIG. 4C
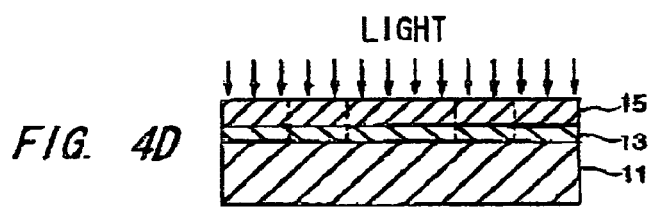
FIG. 4D
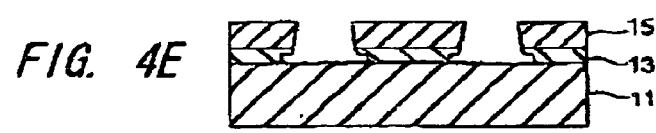
FIG. 4E

SEMICONDUCTOR DEVICE FABRICATION METHOD

The present application is based on Japanese patent application Nos. 2004-185544 and 2005-131009, the entire contents of which are incorporated herein by reference.

BACKGROUND OF THE INVENTION

1. Field of the Invention

This invention relates to a semiconductor device fabrication method involving the step of lift-off patterning of a metal film for forming electrodes and wiring.

2. Description of the Related Art

As a patterning method for electrodes and wiring of semiconductor devices, lift-off processing is used in many cases, in which, as illustrated in FIG. 1A, a resist layer 43 is formed on a semiconductor wafer 41 as a mask, followed by vacuum deposition of a metal film 45 on the resist layer 43, and subsequent immersion thereof in an organic solvent such as acetone or the like to remove the resist layer 43 and the metal film 45 formed thereon.

In this lift-off patterning, a thin sidewall deposition layer 45s is formed on a sidewall of the resist layer 43 by scattered metal particles being deposited thereon during the vacuum deposition of the metal film 45. This sidewall deposition layer 45s prevents the organic solvent from permeating the resist layer 43. For this reason, there is typically used a method for breaking the sidewall deposition layer 45s by applying physical force such as ultrasonic oscillation or the like while immersing the semiconductor wafer 41 in the organic solvent.

Because the cross-section of the positive type resist layer 43 typically used is in a not vertical but slightly forward tapered shape, however, making the metal film 45 thick also makes the sidewall deposition layer 45s thick, which causes difficulty in lift-off, and consequently makes the length of time for the processing long.

Further, as illustrated in FIG. 1B, portion of the sidewall deposition layer 45s which is not completely removed by lift-off is deposited as a burr 45a on the specified-pattern metal film 45 formed subsequent to lift-off processing, or as a burr 45h on the wafer surface adjacent to the metal film 45, or left as a burr 45c in such a manner as to protrude from the metal film 45. As a consequence, there is the problem that a wiring short-circuiting or multilayer wiring disconnection or short-circuiting takes place. For that reason, to make the sidewall deposition layer 45s of the resist layer 43 thin, various attempts have been made to the cross-sectional shape of the resist layer 43.

For example, its methods are exemplified by: as illustrated in FIG. 2A, forming the cross-section of a resist layer 51 in a substantially T-shape (the surface layer of the resist layer 51 in a visor shape), by exposing the positive type resist layer 51 to light, followed by chlorobenzene treatment or deep UV light irradiation to make the surface layer of the resist layer 51 insoluble to a developer, and subsequent development; or as illustrated in FIG. 2B, forming the cross-section of a resist layer 61 in an inverse tapered shape, by forming one resist layer 61, followed by light exposure of its entire surface to form a further resist layer 61 thereon, patterned light exposure and development.

In these methods, however, there is the problem of a drop in precision for resist patterning. As illustrated in FIG. 2C, on the other hand, there is the method for forming the cross-section of a resist layer 71 in a vertical or inverse tapered shape, by image inversion of a positive type resist layer into a negative type resist layer, and subsequent development, which however also poses the problems with the vertical pattern having little effect on making the sidewall deposition layer 45s thin, or with the inverse tapered shape having to intentionally reduce resolution for resist patterning, and making the shape uncontrollable.

As a solution to such problems, there is a fabrication method for a semiconductor device, in which on a substrate or a coating film formed thereover, there is formed a photoresist film consisting of a surface resist layer inverted by only heat treatment after light exposure, and an underlying resist layer formed of a diazo novolac photoresist (see e.g., Japanese patent No. 3339331).

According to the semiconductor device fabrication method described in Japanese patent No. 3339331, since during vacuum deposition of a conductive film, metal particles incident diagonally from a resist pattern are blocked by the surface resist layer formed in a forward tapered shape, no deposition metal particles are deposited on the underlying resist layer processed in an undercut shape As a result, there is formed no sidewall deposition layer joined to a metal pattern that serves as electrodes and wiring, which allows the length of time for lift-off processing to be greatly reduced, while preventing burrs from being produced around the metal pattern formed by lift-off processing.

Because the semiconductor device fabrication method described in Japanese patent No. 3339331 forms the surface resist layer in a forward tapered shape, however, there is a limit on adaptation to a micro metal pattern that serves as electrodes and wiring of the semiconductor device, and it is difficult to ensure precision for micro metal pattern shape, which is because, generally, in forward tapered shapes, precision for tapered shapes has a larger effect on the precision for metal pattern shape subsequently formed than in inverse tapered shapes. In other words, in inverse tapered shapes, since the outermost-protruding portion is positioned at its top, even in case of some minor errors in taper angle, its effect on the precision for metal pattern shape subsequently formed is small, whereas, in forward tapered shapes, since the outermost-protruding portion is positioned at its bottom, even in case or small errors in taper angle, its effect on the precision for metal pattern shape subsequently formed is large.

SUMMARY OF THE INVENTION

It is an object of the present invention to provide a semiconductor device fabrication method that can facilitate the formation of micro patterns with an excellent dimension precision without requiring a long time in lift-off processing.

(1) According to one aspect of the present invention, a semiconductor device fabrication method comprises the steps of:

forming, on a substrate, a positive type photoresist film comprising an underlying resist layer formed of a diazo novolac photoresist and a surface resist layer for being inverted into a negative type by only heat treatment aster light exposure;

inverting the surface resist layer into a negative type by applying a mask and performing light exposure and heat treatment;

exposing the entire surface of the photoresist film to light;

developing the entire surface exposed photoresist film to thereby be processed into a resist pattern, where the surface resist layer is in an inverse tapered shape, while the underlying resist layer is in an undercut shape relative to the surface resist layer;

forming, on the resist pattern, a metal film for forming electrodes and wiring; and performing a patterning by dissolving the resist pattern with a solvent and removing the metal film on the resist pattern.

(2) According to another aspect of the present invention, a semiconductor device fabrication method comprises the steps of:

forming, on a substrate, a positive type photoresist film comprising an underlying resist layer formed of a diazo novolac photoresist and a surface resist layer for being inverted into a negative type by only heat treatment after light exposure;

inverting the surface resist layer into a negative type by applying a mask and performing light exposure and heat treatment;

exposing the entire surface of the photoresist film to light;

developing the entire surface exposed photoresist film to thereby be processed into an inverse tapered-shape resist pattern, forming, on the resist pattern, a metal film for forming electrodes and wiring; and performing a patterning by dissolving the resist pattern with a solvent and removing the metal film on the resist pattern.

These present inventions are excellent in that the underlying resist layer is in an undercut shape relative to the surface resist layer, or the entire resist pattern is in an inverse tapered shape, in comparison to prior art (esp., Japanese patent No. 3339331), which the surface resist layer and resist pattern are in a forward tapered shape, the precision for which largely affects precision for a subsequently-formed metal pattern shape. Namely, the present inventions perform the inversion before forming a resist pattern 30 that the resist pattern formed is in the shape of either the underlying resist layer being in an undercut shape relative to the surface resist layer, or the entire resist pattern being in an inverse tapered shape, whereas the prior art performs the inversion not before but after forming a resist pattern so that the resist pattern formed is in a forward tapered shape.

These present inventions are also excellent in that resist pattern shape can be easily modified in comparison to prior art. Namely, the present inventions are particularly more excellent than prior art in that, to modify resist pattern shape, in the case of small shape modification, the amount of the light exposure to the underlying resist layer in the light exposure of the entire surface has only to be varied, while in the case of such large shape modification as to be impossible to deal with, the film-thickness ratio for the plurality of the resist layers constituting the resist film has only to be varied, although, in prior art, it is impossible to modify resist pattern shape without replacing resist material itself to match that shape.

The above-mentioned inverting step is performed preferably by the heat treatment at 100-110° C.

The above-mentioned step of exposing the entire surface is performed preferably in the range of the amount of the light exposure of the entire surface being 90 mj/cm$^2$ sec-300 mj/cm$^2$ sec.

(3) According to a further aspect of the present invention, a resist pattern comprises:

a surface resist layer and an underlying resist layer formed on a substrate, wherein:

the surface resist layer is in an inverse tapered shape and the underlying resist layer is in an undercut shape relative to the surface resist layer (4) According to a further aspect of the present invention, a metal pattern is fabricated using the above resist pattern.

(5) According to a further aspect of the present invention, a semiconductor device comprises the above metal pattern.

According to the present invention, because of no sidewall deposition layer joined to the metal pattern, lift-off can be facilitated, allowing the length of time for lift-off processing to be greatly reduced. Also, no burrs are caused to the finished metal pattern at all and in addition, regarding precision for the metal pattern, even in the case of a micro metal pattern, by facilitating controlling the resist cross-sectional shape according to the tendency of deposition metal particles to diffract, a high-precision pattern can be formed

BRIEF DESCRIPTION OF THE DRAWINGS

The preferred embodiments according to the invention will be explained below referring to the drawings, wherein:

FIG. 3 is a cross-sectional view illustrating a semiconductor wafer with metal material for electrodes and wiring vacuum-deposited on a resist pattern;

FIGS. 4A-4E are a cross-sectional view illustrating a fabrication process for a resist pattern in the present embodiment;

DETAILED DESCRIPTION OF THE PREFERRED EMBODIMENTS

FIGS. 4A-4E illustrate a fabrication process for a resist pattern in the present embodiment.

First, as illustrated in FIG. 4A, on a semiconductor wafer 11 is formed a diazo novolac positive type photoresist with a film thickness of 1.5-2.5 μm, followed by light exposure of its entire surface, according to needs, to form an underlying resist layer 13. The conditions for this light exposure of entire surface are important in controlling mutual diffusion of resist layer 13 and subsequently-formed surface resist layer 15 often used in an image inversion technique, and the like, as will be explained later.

Next, as illustrated in FIG. 4B, there is formed a surface resist layer 15 with a film thickness of 2.5-3.5 μm, which is often used in the above-mentioned image inversion technique, and the like. In comparison to typical diazo novolac positive type photoresists, the positive type photoresist for this surface resist layer 15 is inverted into a negative type by only light exposure and heat treatment without diffusion processing of an amine-based catalyst after light exposure, so that its light-exposed area is insoluble to alkaline developers.

Next, as illustrated in FIG. 4C, patterned-light exposure and heat treatment (100-110° C.) are performed to the photoresist film consisting of the two resist layers formed. This allows the light-exposed portion of the surface resist layer 15 to change from a positive to negative type resist (image inversion).

Next, as illustrated in FIG. 4D, entire surface is exposed to light, followed by development.

FIG. 4E is a view illustrating the developed resist layers 13 and 15. Only a surface resist layer 15 portion except for the above-mentioned patterned-light-exposed area is developed as a typical positive type photoresist. And an underlying resist layer 13 portion beneath the patterned-light-exposed area of the surface resist layer 15 inverted into a negative type is also developed, which therefore allows the underlying resist layer 13 to be formed in an undercut cross-sectional shape relative to the surface resist layer 15. Further, the surface resist layer 15 has an inverse tapered shape by mutual diffusion with the underlying resist layer 13.

FIG. 6 is views illustrating variations in cross-sectional shape according to conditions for light exposure of entire surface. The conditions for light exposure of the entire surface of the above-mentioned underlying resist layer 13 are important as parameters for controlling the undercut cross-sectional shape, that setting the conditions for light exposure of entire surface allows controlling the cross-sectional shape.

Figure 6A:
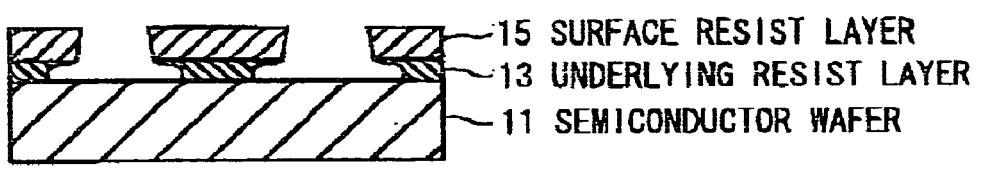
FIGS. 6A-6C are views illustrating variations in cross-sectional shape according to conditions for light exposure of entire surface

FIG. 6A is a view illustrating a cross-sectional shape in the case of a small amount of light exposure of entire surface In this conditions, the mutual diffusion of the underlying resist layer 13 and the surface resist layer 15 becomes small, which allows the underlying resist layer 13 to have a cross-sectional shape whose undercut amount is as large as approximately 5 μm relative to the surface resist layer 15.

Figure 6B:
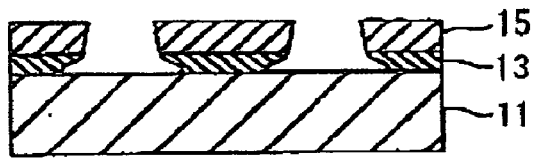

FIG. 6B is a view illustrating a cross-sectional shape when the amount of light exposure of entire surface is adjusted so that the undercut amount is approximately 1 μm.

Figure 6C:
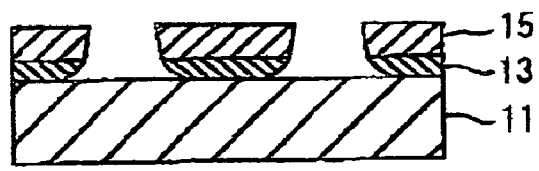

FIG. 6C is a view illustrating a cross-sectional shape in the case of a large amount of light exposure of entire surface. In this conditions, the mutual diffusion of the underlying resist layer 13 and the surface resist layer 15 becomes large, which allows the underlying resist layer 13 to have a substantially inverse tapered shape whose undercut amount is educed to 0.0-0.5 μm.

Which cross-sectional shape of FIGS. 6A, 6B and 6C to use depends on the subsequent step of metal film deposition. Generally, the number of metal particles diffracted to the resist sidewall is varied according to deposition apparatus (incident angles of metal particles). For that reason, in the case of deposition apparatus allowing metal particles to be easily diffracted to the resist sidewall, because their metal film tends to be deposited in the undercut portion, the conditions for FIG. 6B or 6C are adopted instead of the conditions for FIG. 6A, taking account of pattern precision.

The amount of light exposure of entire surface in this embodiment is 90 mj/cm$^2$ sec in the FIG. 6A conditions, 200 mj/cm$^2$ sec in the FIG. 6B conditions, and 300 mj/cm$^2$ sec in the FIG. 6C conditions.

FIG. 3 is a cross-sectional view illustrating a semiconductor wafer 11 with metal material for electrodes and wiring vacuum-deposited on a resist pattern 10. It illustrates a state of the semiconductor wafer 11 prior to lift-off processing, on which are deposited the resist pattern 10 formed in the present embodiment and a metal film formed using the resist pattern 10 as a mask.

As illustrated in FIG. 3, a metal pattern of the present invention is surrounded by the resist pattern 10, by separating a sidewall deposition layer 20s above the semiconductor wafer 11.

Figure 1A:
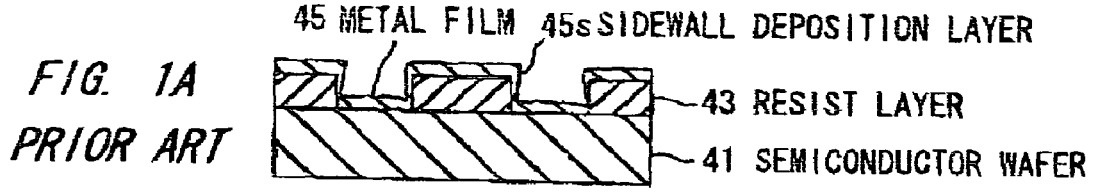
FIG. 1A is a cross-sectional view illustrating a metal pattern formed on a semiconductor wafer by a conventional method, in which a metal film is formed by using a positive-type resist film as a mask.
Figure 1B:
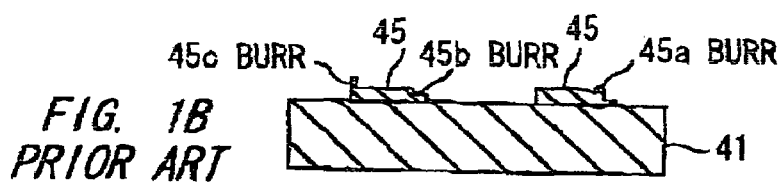
FIG. 1B is a cross-sectional view illustrating a metal pattern formed on the semiconductor wafer by a conventional method, in which lift-off processing is performed on the semiconductor wafer of FIG. 1A.
Figure 2A:
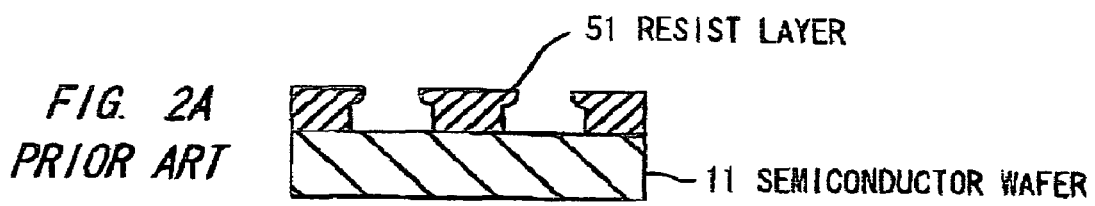
FIGS. 2A-2C are a cross-sectional view illustrating a resist pattern formed on a semiconductor wafer by a conventional method.
Figure 2B:
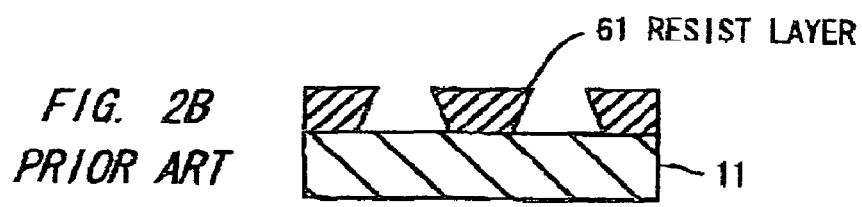
Figure 2C:
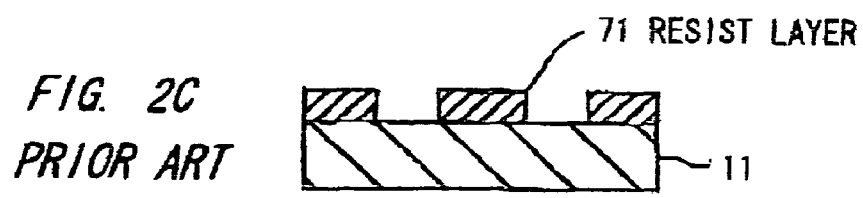
Figure 5:
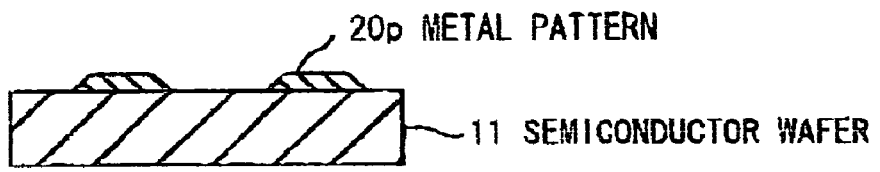
FIG. 5 is a cross-sectional view illustrating a metal pattern formed on a semiconductor wafer.

And by immersing this metal film 20o—formed semiconductor wafer 11 in an organic solvent such as acetone or the like to lift-off the underlying resist layer 13, surface resist layer 15 and metal film 20o formed on its surface, there is formed only the metal pattern 20p that serves as electrodes and wiring of the semiconductor device. FIG. 5 illustrates the metal pattern 20p thus formed.

As illustrated in FIG. 3, by ensuring to split the metal film at the resist sidewall, the length of time for lift-off processing can be greatly reduced, while no burrs are caused around the metal pattern 20p at all Regarding dimension precision for the metal pattern 20p, by controlling the resist cross-sectional shape to match precision required in the fabrication of the semiconductor device, its required dimension precision can be obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device fabrication method, comprising:
    forming, on a substrate, a positive type photoresist film comprising an underlying resist layer formed of a diazo novolac photoresist and a surface resist layer for being inverted into a negative type by only heat treatment after light exposure;
    inverting the surface resist layer into a negative type by applying a mask and performing light exposure and heat treatment;
    exposing the entire surface of the photoresist film to light;
    developing the entire-surface-exposed photoresist film to thereby be processed into a resist pattern, where the surface resist layer is in an inverse tapered shape, while the underlying resist layer is in an undercut shape relative to the surface resist layer;
    forming, on the resist pattern, a metal film for forming electrodes and wiring; and
    performing a patterning by dissolving the resist pattern with a solvent and removing the metal film on the resist pattern.

2. A semiconductor device fabrication method, comprising:
    forming, on a substrate, a positive type photoresist film comprising an underlying resist layer formed of a diazo novolac photoresist and a surface resist layer for being inverted into a negative type by only heat treatment after light exposure;
    inverting the surface resist layer into a negative type by applying a mask and performing light exposure and heat treatment;
    exposing the entire surface of the photoresist film to light;
    developing the entire-surface-exposed photoresist film to thereby be processed into an inverse tapered-shape resist pattern;
    forming, on the resist pattern, a metal film for forming electrodes and wiring; and
    performing a patterning by dissolving the resist pattern with a solvent and removing the metal film on the resist pattern.

3. The semiconductor device fabrication method according to claim 1, wherein:
the inverting is performed by the heat treatment at 100-110° C.

4. The semiconductor device fabrication method according to claim 2, wherein;
the inverting step is performed by the heat treatment at 100-110° C.

5. The semiconductor device fabrication method according to claim 1, wherein:
the exposing the entire surface is performed in the range of the amount of the light exposure of the entire surface being 90 mj/cm$^2$ sec-300 mj/cm$^2$ sec.

6. The semiconductor device fabrication method according to claim 2, wherein:
the exposing the entire surface is performed in the range of the amount of the light exposure of the entire surface being 90 mj/cm$^2$ sec-300 mj/cm$^2$ sec.

* * * * *